United States Patent
Hayashi et al.

(10) Patent No.: US 6,784,118 B2
(45) Date of Patent: Aug. 31, 2004

(54) METHOD FOR VAPORIZATION OF LIQUID ORGANIC FEEDSTOCK AND METHOD FOR GROWTH OF INSULATION FILM

(75) Inventors: Yoshihiro Hayashi, Tokyo (JP); Jun Kawahara, Tokyo (JP); Hirofumi Ono, Shiga (JP)

(73) Assignee: NEC Corporation, Tokyo (JP)

( * ) Notice: Subject to any disclaimer, the term of this patent is extended or adjusted under 35 U.S.C. 154(b) by 294 days.

(21) Appl. No.: 09/838,343

(22) Filed: Apr. 20, 2001

(65) Prior Publication Data

US 2002/0009545 A1 Jan. 24, 2002

(30) Foreign Application Priority Data

Apr. 20, 2000 (JP) ........................................ 2000-119023

(51) Int. Cl.[7] ........................ H01L 21/31; H01L 21/469
(52) U.S. Cl. ........................ 438/779; 438/780; 438/789; 438/790
(58) Field of Search ........................ 438/779, 780, 438/789, 790

(56) References Cited

U.S. PATENT DOCUMENTS

| | | | |
|---|---|---|---|
| 4,855,112 A | * | 8/1989 | Adcock .................. 422/186.23 |
| 6,054,395 A | * | 4/2000 | Knappenberger ........... 438/758 |
| 6,083,661 A | * | 7/2000 | Oaks et al. .............. 430/286.1 |
| 6,349,668 B1 | * | 2/2002 | Sun et al. ................ 118/723 R |
| 6,387,453 B1 | * | 5/2002 | Brinker et al. .............. 427/387 |

FOREIGN PATENT DOCUMENTS

| | | |
|---|---|---|
| JP | 38330 A | 1/1991 |
| JP | 5-175134 A | 7/1993 |
| JP | 8-288242 A | 11/1996 |
| JP | 11-17006 | 1/1999 |
| JP | 2000-12532 | 1/2000 |
| WO | WO 85/03460 | * 8/1985 |

OTHER PUBLICATIONS

Stokich, Jr. et al., "Real–Time FT–IR Studies of the Reaction Kinetics for the Polymerization of Divinyl Siloxane Bis–Benzocyclobutene Monomers", *Material Research Symposium Proceeding*, vol. 227, 1991, pp. 103–114.

* cited by examiner

*Primary Examiner*—HsienMing Lee
(74) *Attorney, Agent, or Firm*—Sughrue Mion, PLLC

(57) ABSTRACT

In order to vaporize an organic monomer at a high temperature and a high saturated vapor pressure in good efficiency and to grow an organic polymer film at a high rate in high vacuum by a plasma polymerization reaction of the resulting organic monomer gas, a liquid divinylsiloxanebisbenzocyclobutene (DVS-BCB) monomer is mixed with a carrier gas, and the mixture is then sprayed on a vaporization vacuum chamber held at a high temperature to form an aerosol made of liquid fine particles of the organic monomer, and a BCB monomer (organic monomer) is instantaneously vaporized via the aerosol to generate a BCB monomer gas (organic monomer gas). Consequently, the aerosol having a large specific surface area has a large vaporization area, and vaporization occurs by heating at a high temperature before a polymerization reaction occurs. Thus, 0.1 g/min or more of the BCB monomer gas can be formed at 200° C. and a high saturated vapor pressure, and a plasma polymerization BCB film can be formed at a high rate which is at least 5 times higher than in the ordinary film formation.

9 Claims, 13 Drawing Sheets

METHOD FOR VAPORIZATION OF LIQUID ORGANIC FEEDSTOCK AND METHOD FOR GROWTH OF INSULATION FILM

BACKGROUND OF THE INVENTION

1. Field of the Invention

The present invention relates to a method for vaporization of liquid organic feedstock and a method for growth of an insulation film, especially to a method for producing a functional organic polymer film that insulates a multilayer wiring gap of a semiconductor integrated circuit. More specifically, it relates to a method for vaporization of liquid organic feedstock made of an organic monomer or an organic oligomer which is a constituent of a functional organic polymer film.

2. Description of the Related Art

A semiconductor integrated circuit is being downsized in designing rule, and consequently deterioration of performance due to delay by wiring is notably observed. That is, a wiring signal delay of a semiconductor integrated circuit is determined with a wiring CR time constant (C: wiring capacity, R: wiring resistance). Because of the increase in wiring resistance due to the decrease in wiring width and the increase in wiring gap capacity due to the decrease in wiring gap, there is a fear that the wiring CR time constant may not come up with the improvement in switching speed of transistors. An aluminum alloy is currently used as a wiring material of a semiconductor integrated circuit. However, owing to the decrease in resistance of a wiring, a copper wiring or a silver wiring has been studied.

Meanwhile, for reducing a wiring gap capacity, an insulation film material having a lower dielectric constant than the existing silica ($SiO_2$) insulation film has been studied. As an insulation film having a low dielectric constant, fluorine-containing silica (SiOF), porous silica and an organic polymer film (organic insulation film) are known. Fluorine-containing silica is problematic in that corrosion of a wiring metal occurs with hydrofluoric acid through a reaction between fluorine in the film and moisture or hydrogen or a dielectric constant is increased by eliminating fluorine. Porous silica is expected because a specific dielectric constant can be less than 2.

However, sometimes, a specific dielectric constant is increased by condensation of moisture to a micro-hole or an insulation pressure resistance is decreased. At present, the development of an organic polymer film excellent in heat resistance and moisture resistance has been in urgent demand as a layer-to-layer insulation film that insulates a multilayer wiring gap on a semiconductor integrated circuit. With respect to the moisture resistance, it is important that a hydrophilic group is absent in an organic monomer, and it is advisable that a polymerization reaction of an organic monomer which is a constituent of the organic polymer film does not undergo a polycondensation reaction of water. The organic monomer herein is a material that, as a structural unit, causes a polymerization reaction to form an organic polymer.

As a method for growth of the functional organic polymer film, there is a spin coating method of an organic monomer (hereinafter referred to as a first ordinary example). This spin coating method has been widely used in growth of an organic polymer film. In this case, an organic monomer is dissolved in a solvent. During film formation, a solvent is removed, and a polymerization reaction proceeds by heating an organic monomer. Consequently, a two-dimensional or three-dimensional network film or a polymer film is formed. An organic monomer dissolved in an organic solvent becomes a structure of an organic insulation film as a product.

For example, a method in which a divinylsiloxanebisbenzocyclobutene polymer film is formed by spin coating is described in, for example, "REAL-TIME FT-IR STUDIES OF THE REACTION KINETICS FOR THE POLYMERIZATION OF DIVINYLSILOXANEBISBENZOCYCLOBUTENE MONOMERS" (material Research Symposium Proceeding vol. 227, p, 103, 1991), T. M. Stokich, Jr., W. M. Lee, R. A. Peters (hereinafter referred to as reference 1).

Japanese Patent Laid-Open (JP-A) No. 17006/1999 proposes a method for evaporation of an organic monomer (hereinafter referred to as a second ordinary example) as a method for growth of a functional organic polymer film. In this method, an organic monomer is evaporated, and a monomer in a gaseous phase is polymerized on a substrate to obtain an organic polymer film.

Japanese Patent Laid-Open (JP-A) No. 12532/2000 proposes a method for growth of a polymer film by vaporization of an organic monomer using a carrier gas (hereinafter referred to as a third ordinary example) as a method for growth of a functional organic polymer film. In this method, a polymer film is grown by a step of feeding a liquid organic monomer to a vaporization controller, a step of heating the liquid organic monomer in the vaporization controller, feeding a carrier gas and vaporizing the organic monomer while keeping a partial pressure of the liquid organic monomer lower than a saturated vapor pressure and a step of transporting the carrier gas containing this vaporized organic monomer from the vaporization controller to a reaction chamber, further passing the organic monomer through RF plasma to activate the same and spraying the resulting product on a surface of a substrate mounted in the reaction chamber to grow a polymer film containing the organic monomer in the structure.

Specifically, in the third ordinary example, divinylsiloxanebisbenzocyclobutene (DVS-BCB) is vaporized by feeding 100 to 3,000 sccm of the carrier gas into the vaporization controller held at the total pressure of 20 torr or less, feeding 0.1 to 0.01 g/min of the DVS-BCB monomer into the vaporization controller and heating the mixture at a temperature of 100 to 175° C. Further, the vaporized organic monomer is introduced into a plasma gas atmosphere to expedite the polymerization reaction of the organic monomer and decrease the growth temperature of the organic polymer film. The ring opening reaction of the carbon 4-membered ring in the benzocyclobutene structure is started at a lower temperature by generation of plasma to obtain a polymer film made of a three-dimensional polymer chain containing the DVS-BCB monomer in the structure.

The first to third ordinary examples however involve the following problems.

In the first ordinary example, the organic monomer is dissolved in the solvent, and the solution is spin-coated. In the spin coating, approximately 90% of the solution is scattered outside the substrate. Thus, the use efficiency of the feedstock is bad.

Further, the spin-coated film is heated, and the solvent is first removed. Then, the residue is further heated at a high temperature to cause the polymerization reaction of the organic monomer and form the organic polymer film. When oxygen is present in a baking oven, oxygen and a part of the organic monomer are sometimes reacted so that a desired organic polymer film is not formed. For example, a permissible oxygen concentration in spin-coating the solution of the DVS-BCB monomer in mesitylene and then baking the same is 100 ppm or less. For this reason, the whole part of the baking oven has to be purged with a nitrogen gas. Accordingly, this method cannot be realized at low costs.

Still further, dissolved oxygen dissolved in the solvent is sometimes reacted with the organic monomer in the baking. Thus, it is required to strictly control the atmosphere. However, it is difficult to strictly control the atmosphere in the spin coating.

Furthermore, the spin coating is conducted in a spin coating chamber from which a gas is locally exhausted. At this time, floating refuge or fine particles of the organic monomer adhered to the inner wall of the spin coating chamber and dry-solidified are sometimes incorporated into the spin-coated film to degrade the film.

Moreover, the spin coating is problematic in that it requires a large amount of an organic solvent to invite great environmental burden.

The second ordinary example is excellent in that it is quite good in the use efficiency of the raw material in comparison with the spin coating method. However, since the overall liquid organic monomer is vaporized from the gas-liquid interface, it is required to heat a large volume of the organic monomer at a high temperature. Meanwhile, since the organic monomer is reactive, there is a likelihood that the polymerization reaction proceeds at a high temperature and the vaporization of the organic monomer is instable. Thus, it is necessary to improve this instability.

In the third ordinary example, the liquid organic monomer is fed to the vaporization chamber via the monomer feed hole to form a liquid film. Such a liquid organic monomer is heated to a predetermined temperature by a heater, and then contacted with the carrier gas in the vaporization chamber. Incidentally, since the vapor pressure of the organic monomer is increased with the increase in temperature, it is advantageous for the increase in vaporization efficiency. Meanwhile, the organic monomer is increased in its polymerization rate with the increase in temperature. Consequently, when the temperature is too high, the organic monomer is polymerized and solidified before being vaporized.

For the organic monomer to be vaporized satisfactorily without increasing the temperature, the flow rate of the carrier gas is increased. Nevertheless, when the flow rate of the carrier gas fed to the narrow vaporization chamber is increased, there arises a problem that the pressure inside the vaporization chamber is increased owing to the pressure loss of the vaporization chamber.

SUMMARY OF THE INVENTION

It is an object of the present invention to provide a method for vaporization of liquid organic feedstock in which liquid organic feedstock can be vaporized in good efficiency.

It is another object of the present invention to provide a method for growth of an organic polymer film made of an organic monomer by activating a vaporization monomer in plasma and polymerizing this monomer on a substrate.

In accordance with the invention, there is provided a method for vaporization of liquid organic feedstock made of an organic monomer or an organic oligomer capable of forming an organic polymer insulation film by feeding the liquid organic feedstock to a vaporization controller, which comprises a first step of mixing the liquid organic feedstock with a carrier gas at a temperature lower than a heat polymerization reaction starting temperature of the liquid organic feedstock to form a gas-liquid mixed fluid, a second step of spraying the gas-liquid mixed fluid on a vaporization vacuum chamber to form an aerosol of the liquid organic feedstock and heating the aerosol, and a third step of vaporizing the liquid organic feedstock through the aerosol.

The aerosol has a diameter of, for example, 100 to 1 $\mu$m, and the liquid organic feedstock is, for example, a divinylsiloxanebisbenzocyclobutene monomer. Specifically, in a standard condition, the gas-liquid mixed fluid made of 100 to 500 ml/min of the carrier gas and 0.1 to 0.5 g/min of the liquid organic feedstock is sprayed on the vaporization vacuum chamber held at 1.3 kPa (10 torr) or less, and heated at a temperature of 160 to 250° C. to vaporize the liquid organic feedstock.

Further, according to the invention, there is provided a method for growth of an insulation film, wherein a vaporization device for heating an aerosol of liquid organic feedstock to vaporize the liquid organic feedstock through the aerosol and form the vaporized organic feedstock is directly connected with a plasma polymerization reaction chamber, and the vaporized organic feedstock is directly fed to plasma in the plasma polymerization reaction chamber to grow an organic polymer film made of the liquid organic feedstock on a substrate.

In the invention, since the diameter of the aerosol is 100 $\mu$m or less, a specific surface area is large, as compared with an ordinary vaporization method in which a liquid film is heated, to increase a vaporization sectional area of the organic monomer, which makes it possible to instantaneously vaporize the same after heating. As a result, the organic monomer can be vaporized at a high temperature and a high vapor pressure to increase a vaporization rate. Moreover, since vaporization can instantaneously be conducted after the heating, the technical problem peculiar to the vaporization of the organic monomer in which the organic monomer is polymerized and solidified by heating at a high temperature can be solved.

Since the carrier gas containing the organic monomer allows the polymerization reaction of the organic monomer on the substrate in the reaction chamber which is closed with a gas exhausted by a pump and to which RF plasma is applied, the organic monomer is not reacted with a reactive gas such as oxygen, nor does deterioration of characteristics such as the increase in dielectric constant owing to oxidation of a part of the resulting polymer film occur.

PREFERRED EMBODIMENTS OF THE INVENTION

Figure 1:
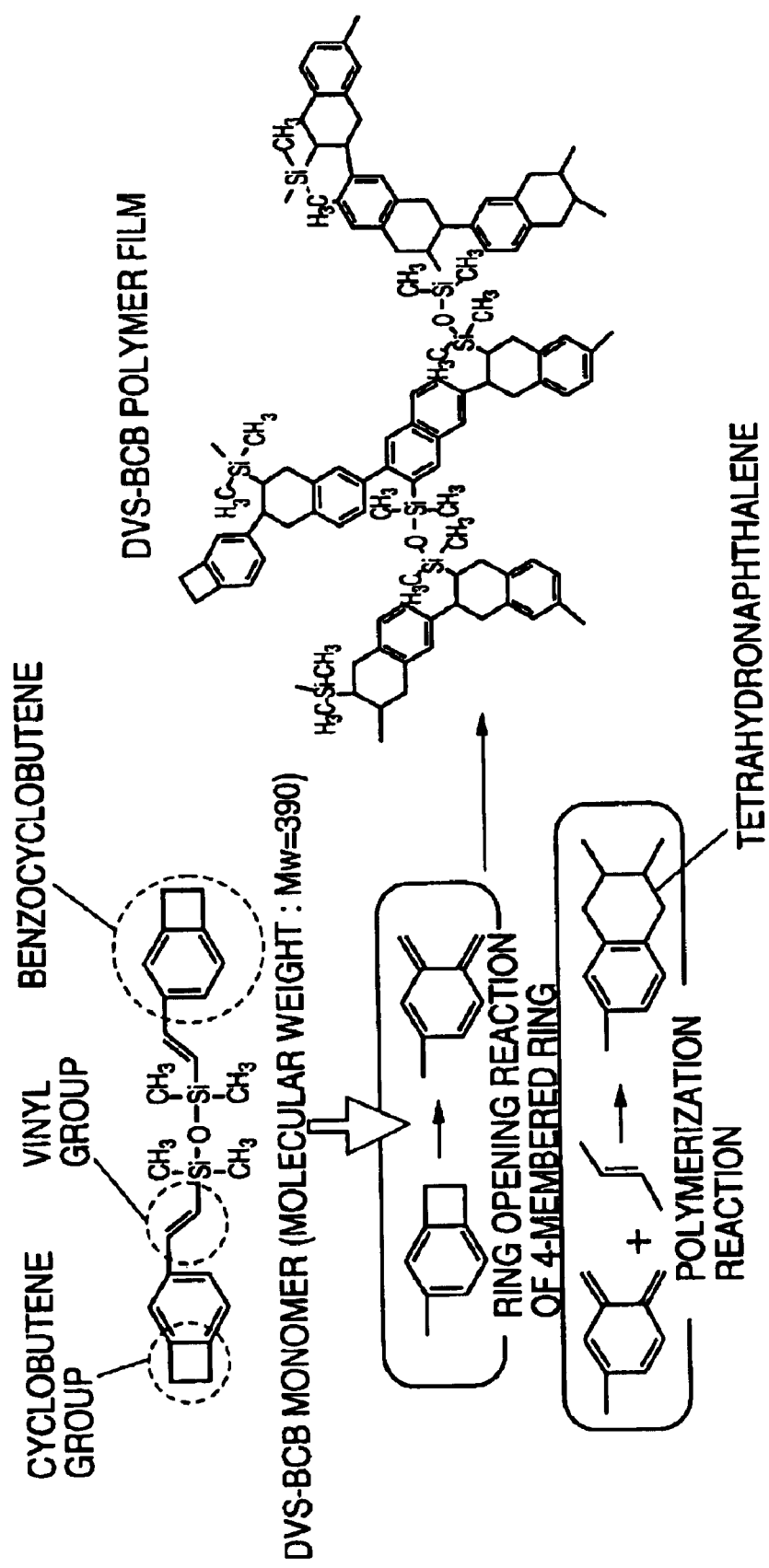
FIG. 1 is a flow chart describing formation of a DVS-BCB polymer film from a DVS-BCB monomer according to a first ordinary example.

Before describing embodiments of the invention, methods according to the related art are described by referring to the drawings.

In reference 1, as shown in FIG. 1, a solution of a divinylsiloxanebisbenzocyclobutene monomer in mesitylene is spin-coated, and then baked at a temperature of 100° C. to remove mesitylene as a solvent. Further, the product is heated to a temperature of 300 to 350° C., and an organic polymer film (DVS-BCB polymer film) with a three-dimensional polymer chain made of a divinylsiloxanebisbenzocyclobutene monomer represented by the formula of FIG. 1 is grown by a thermal ring opening reaction of a carbon 4-membered ring in benzocyclobutene and a polymerization reaction with a vinyl group.

Figure 2:
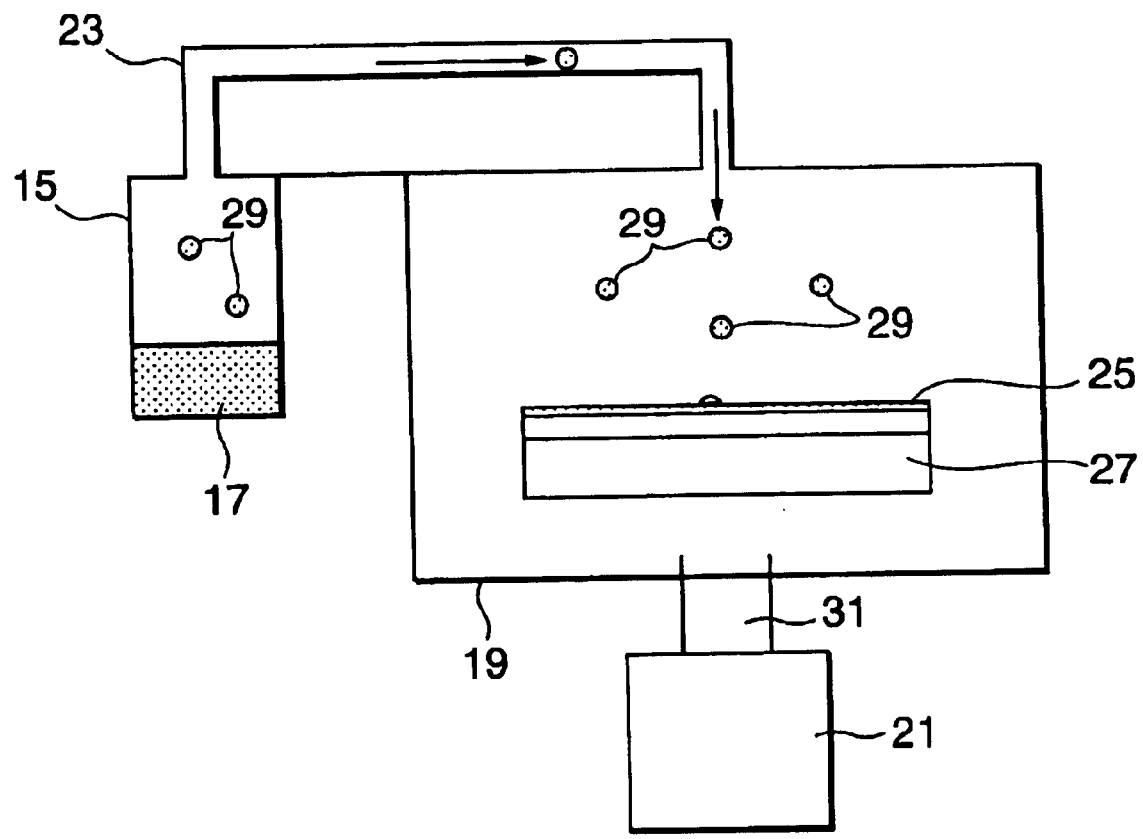
FIG. 2 is a schematic view describing a method for vaporization of liquid organic feedstock according to a second ordinary example.

In the apparatus for growth of the organic film by the direct vaporization of the organic monomer in the second ordinary example, as shown in FIG. 2, an organic monomer 17 in a tank 15 is first evaporated by being heated under reduced pressure. Then, a plasma polymerization reaction chamber 19 is evacuated with an exhaust pump 21, and the organic monomer evaporated is fed to the plasma polymerization reaction chamber 19 via a vaporized feedstock piping 23. The organic monomer molecules are adsorbed on a surface of a semiconductor substrate 25 having a semiconductor integrated circuit formed thereon, and a polymerization reaction proceeds with heat energy supplied by a substrate heating portion 27 to form a crosslinked structure and provide an organic insulation film. By the way, reference numeral 29 indicates an organic monomer evaporated.

Figure 3:
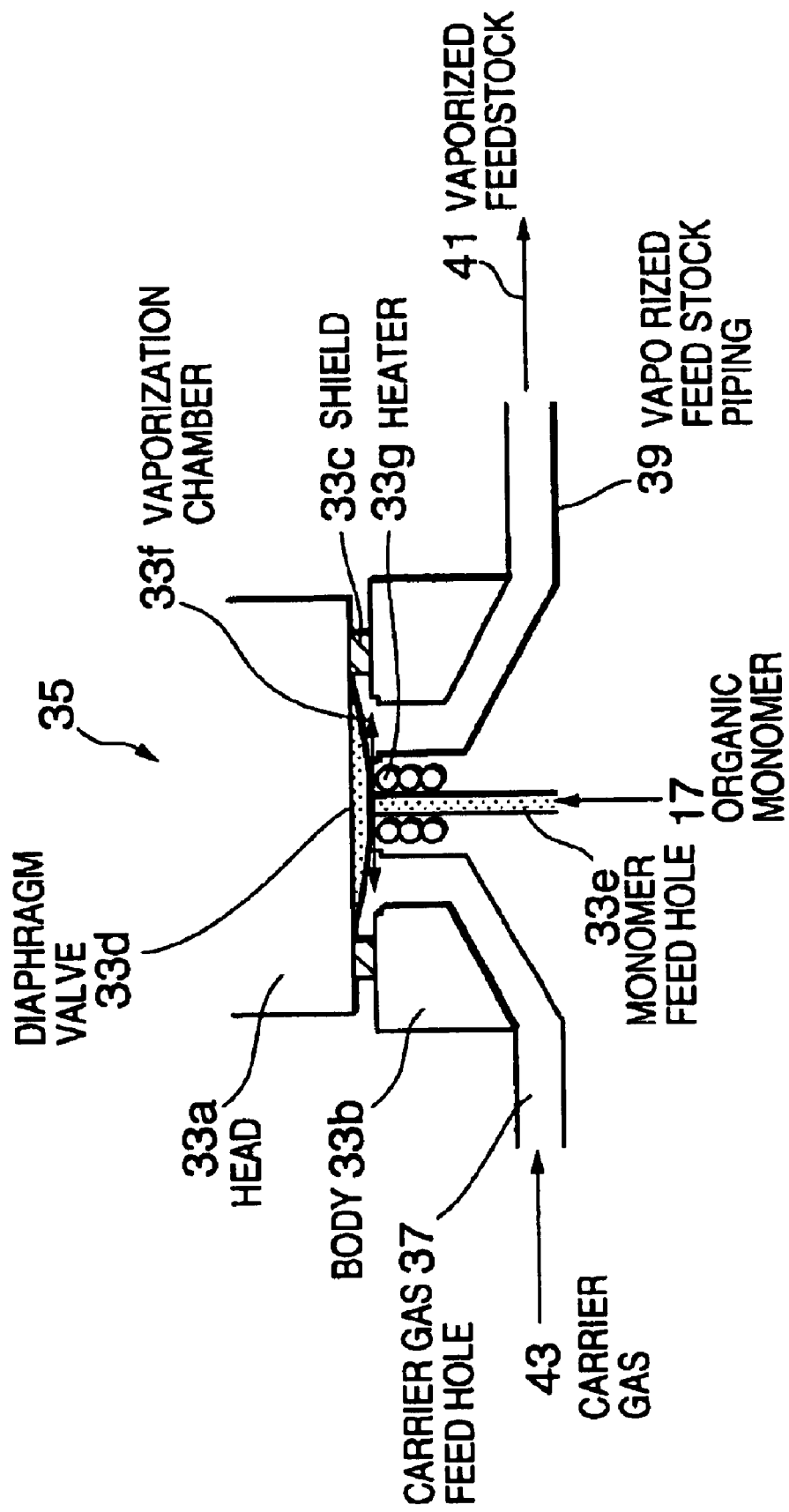
FIG. 3 is a schematic view describing a method for vaporization of liquid organic feedstock according to a third ordinary example.

In the organic monomer vaporization method using the carrier gas according to the third ordinary example, as shown in FIG. 3, a vaporization controller 35 is so adapted that a small space between a head 33*a* and a body 33*b* with a shield 33*c* interposed is used as a vaporization chamber 33*f* to which the carrier gas is fed from a piping 37 having a carrier gas feed hole of the body 33*b* and a DVS-BCB monomer (organic monomer 17) from an organic monomer feed hole 33*e* respectively.

That is, the organic monomer 17 is heated at a predetermined temperature with a heater 33*g* for heating the organic monomer, the surrounding portion of the organic monomer feed hole 33*e* and the portion near the surface of the body 33*b*. In this case, since the liquid organic monomer is spread in the form of a liquid film to the small space between the head 33*a* and the body 33*b*, the heating efficiency is good. The vaporization chamber 33*f* is evacuated via a vaporized feedstock piping 39 connected with a reaction chamber 19 evacuated with the exhaust pump 21, and an organic monomer 41 vaporized is carried with a carrier gas 43. A diaphragm valve 33*d* mounted on a head just above the monomer feed hole 33*e* is vertically driven with a piezo-element to feed a fixed flow rate of the organic monomer, and an opening of the organic monomer feed hole 33*e* is then closed.

Since the upper and lower main surfaces of the liquid organic monomer film are brought into contact with the head 33*a* and the body 33*b* respectively, vaporization cannot occur from these surfaces. It is only from end surfaces of the liquid film that vaporization can occur. Consequently, the vaporization rate is low. Thus, there is a problem that the vaporization rate is lower than the polymerization rate in the heating at a high temperature and no satisfactory vaporization of the organic monomer is conducted.

Figure 4:
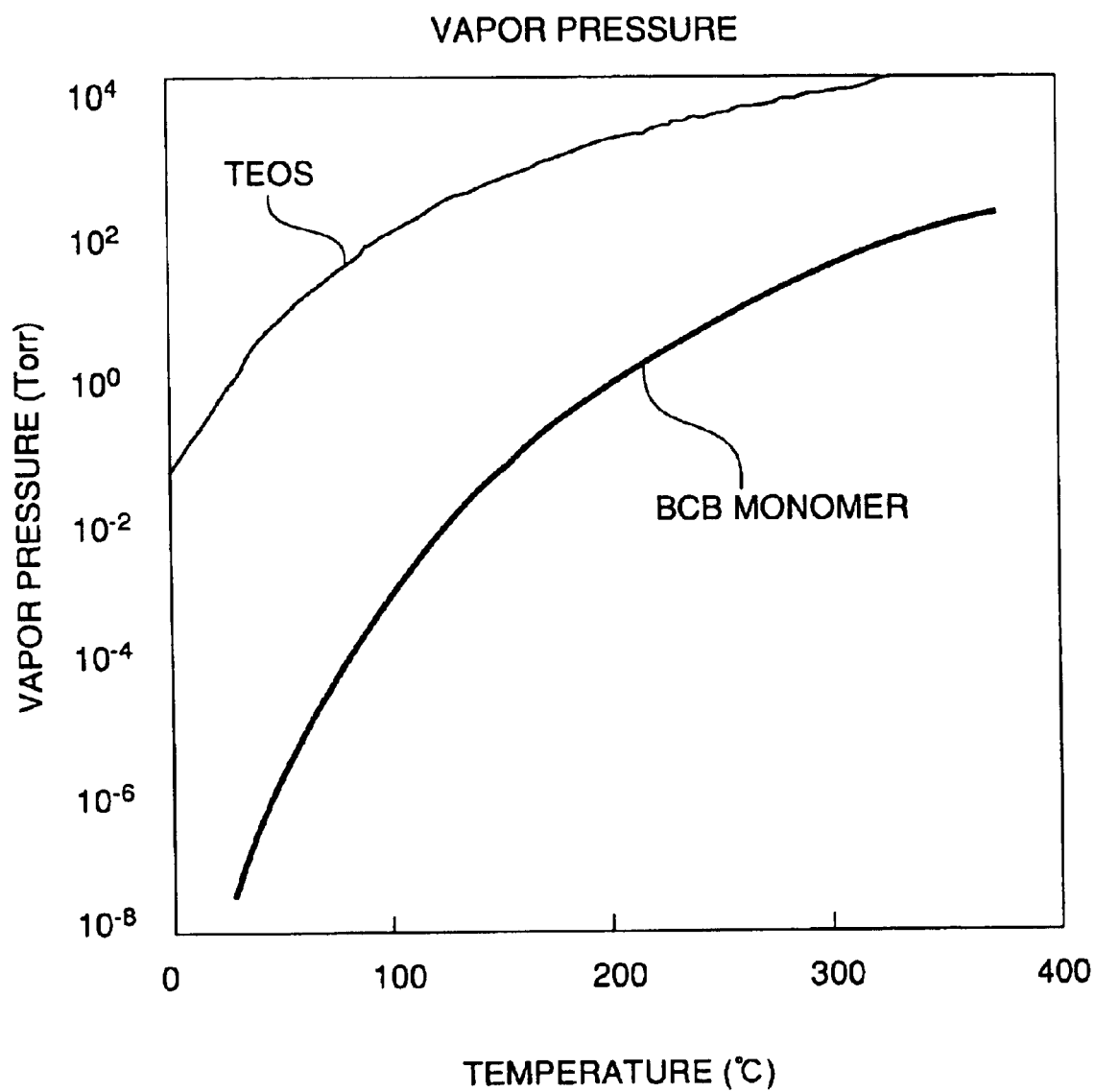
FIG. 4 is a graph showing a relation between a saturated vapor pressure and a temperature of a DVS-BCB monomer and TEOS (tetraethyl orthosilicate)

For example, as shown in FIG. 4, a divinylsiloxanebisbenzocyclobutene monomer (hereinafter referred to as a BCB monomer) has a saturated vapor pressure which is lower than that of TEOS (tetraethyl orthosilicate) used for growth of a plasma oxide film by 3 or 4 figures. For example, the saturated vapor pressure of TEOS at room temperature is 1 torr, whereas that of the BCB monomer requires heating at 200° C. for obtaining at least 1 torr.

Figure 5:
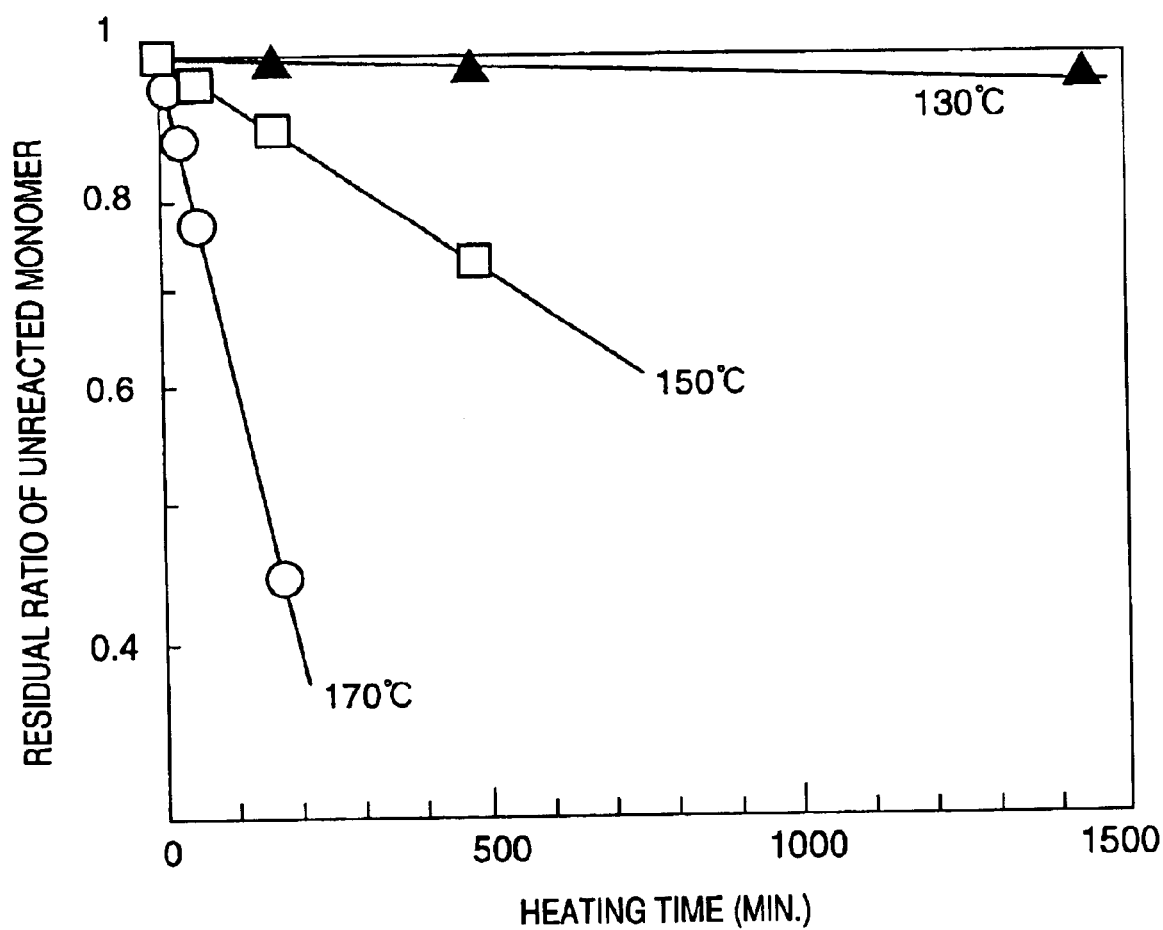
FIG. 5 is a graph showing a relation between a heating temperature of a DVS-BCB monomer and a ratio of an unreacted monomer.

Meanwhile, as shown in FIG. 5, the polymerization rate of the BCB monomer is increased as the temperature rises. When the BCB monomer is heated at a temperature of 150° C. for 1 minute, only 0.03% of the monomer is polymerized. Meanwhile, when the temperature is 170° C., the polymerization rate is increased to 0.24%. When the temperature is 180° C., it reaches 1% or more. When the temperature is further increased, it is advantageous because the saturated vapor pressure is increased. However, since the vaporization rate is low in the vaporization from only the end surfaces of the BCB monomer liquid film, the practical heating temperature of the organic monomer is limited to approximately 150° C.

The embodiments of the invention are described below by referring to the drawings.

First, a method for vaporization of liquid organic feedstock made of an organic monomer or an organic oligomer capable of forming an organic polymer insulation film according to the invention is described. The following description is made upon taking the vaporization of the organic monomer as an example. However, the organic oligomer can also be applied.

Figure 6:
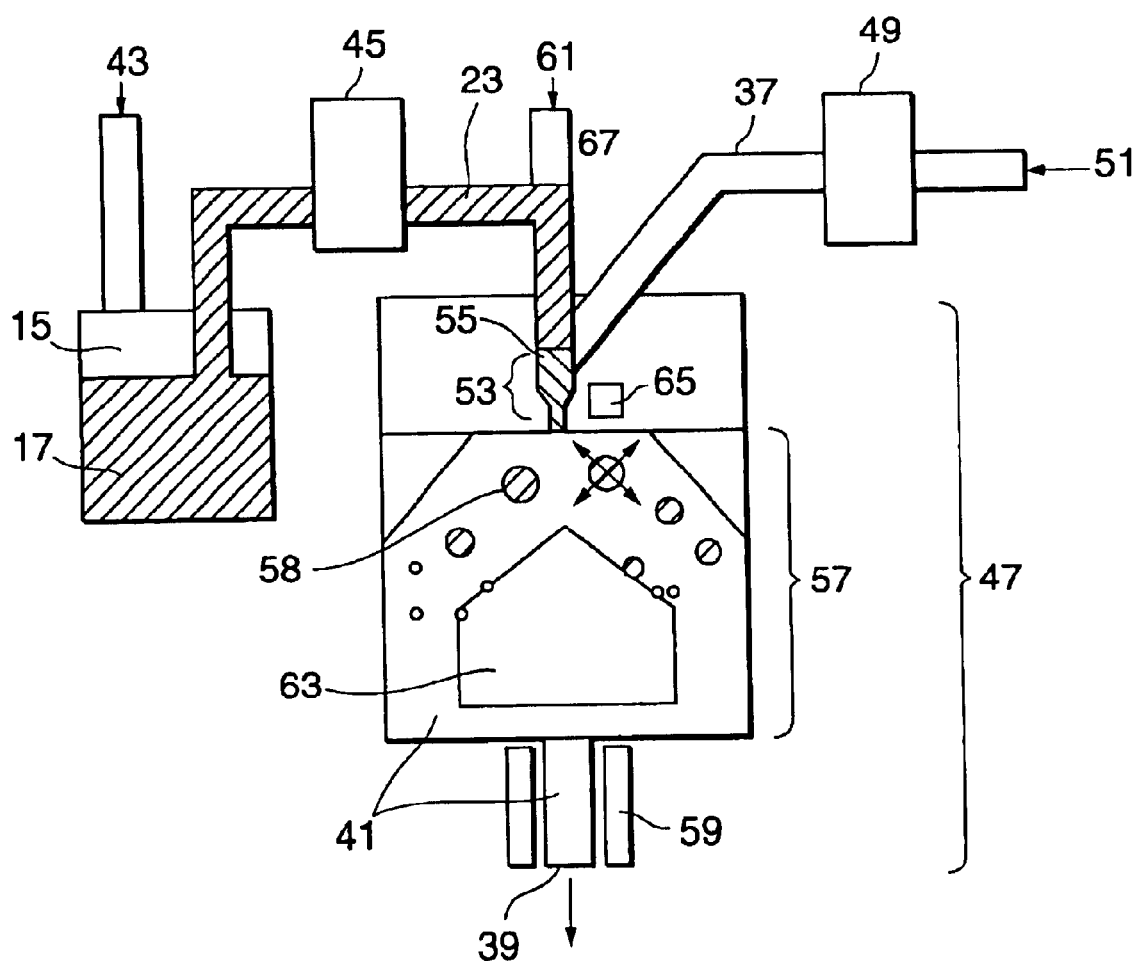
FIG. 6 is a schematic view showing an example of a vaporization method according to the invention.

As shown in FIG. 6, a liquid organic monomer 17 stored in a feedstock tank 15 is fed to a feedstock piping 23, and then to an organic monomer vaporization chamber 47 via a liquid mass flow controller 45 at a predetermined rate. On the other hand, a carrier gas 51 is also fed from a carrier gas piping 37 to the organic monomer vaporization chamber 47 via a gas mass flow controller 49. Actually, the timing of feeding the carrier gas and the organic monomer is controlled with solenoid valves (not shown) mounted between the vaporization chamber 47 and the mass flow controllers 45, 49. The liquid organic monomer and the carrier gas are mixed in a mixing nozzle portion 53 of the organic monomer vaporization chamber 47 to form a gas-liquid mixed fluid 55. The diameter of the mixing nozzle portion 53 is rendered smaller than the diameters of the carrier gas piping 37 and the feedstock piping 23, and the fluid is sprayed from the mixing nozzle portion to a vaporization vacuum chamber 57. At this time, owing to the abrupt pressure loss of the mixing nozzle portion 53 and the vaporization vacuum chamber 57, the gas-liquid mixed fluid 55 is converted into an aerosol 58 of the organic monomer having a diameter of 100 μm or less in the vaporization vacuum chamber 57. With respect to the formation of the aerosol, it is quite important to select the diameter of the mixing nozzle portion 53 and the flow rate of the carrier gas. When the flow rate of the carrier gas is 50 to 500 sccm, the diameter of the mixing nozzle is 1 to 0.2 mm. The gas-liquid mixed fluid may be preheated to a temperature which is approximately 20° C. lower than the polymerization starting temperature of the organic monomer through a block heater 65 near the mixing nozzle portion 53. Or, the carrier gas may be preheated.

A block heater 63 heated at a predetermined temperature is installed in the vaporization vacuum chamber 57, and the aerosol 58 of the organic monomer is heated through the block heater 63. Such an aerosol 58 is vaporized by heating to form an organic monomer gas 41 which is discharged from a vaporized feedstock piping 39 along with the carrier gas. Although a part of the aerosol is adhered to the surface of the block heater 63, this aerosol 58 is also instantaneously vaporized. The resulting organic monomer gas 41 is fed to a reaction chamber via the vaporized feedstock piping 39, activated through RF plasma, and then subjected to a polymerization reaction on a substrate heated at 300° C. to 420° C. to grow an organic polymer film. A piping heater 59 is wound around the vaporized feedstock piping 39 lest the piping has a temperature which is less than the vaporization temperature of the vaporization vacuum chamber. In this manner, re-liquefaction of the organic monomer gas 41 is prevented.

With respect to the organic monomer, any organic monomer having a reactive functional group for polymerization can be used in the production of the polymer film in the invention. In consideration of the easy feeding to the vaporization controller, it is preferable that the organic monomer is liquid. A monomer which is liquid at room temperature is most preferable. However, with respect to a monomer which is solid at room temperature, the invention is quite effective as a method for growth of a polymer film of a divinylsiloxanebisbenzocyclobutene monomer (hereinafter referred to as a DVS-BCB monomer) in case of forming a layer-to-layer insulation film on a semiconductor substrate at such a temperature that polymerization is not drastic. The DVS-BCB monomer used in one embodiment is a liquid having a viscosity of 75 cP at room temperature, and it is an organic monomer used to form a layer-to-layer insulation film having a low dielectric constant on a semiconductor substrate in particular.

On this occasion, as the carrier gas of the organic monomer, an inert gas to the organic monomer can be used, examples thereof being a hydrogen gas, a nitrogen gas, a helium gas, an argon gas and a neon gas. When the DVS-BCB monomer is used as the organic monomer, a helium gas having a high heat conductivity is preferable because the growth stability of the polymer film is increased and a superhigh-speed semiconductor integrated circuit can be produced with high productivity.

The monomer and the oligomer used in the invention can form an organic polymer insulation film. It is advisable that the monomer and the oligomer do not form by-products in the polymerization. The monomer and the oligomer can include, other than the DVS-BCB monomer, the following monomers and oligomers formed therefrom.

fluoronaphthalene

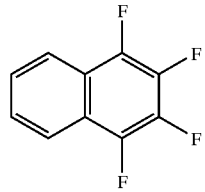

naphthalene

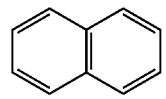

maleimidobenzocyclobutene

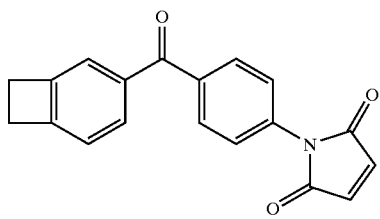

perfluorocyclobutene aromatic ether (PFCB)
PFCB

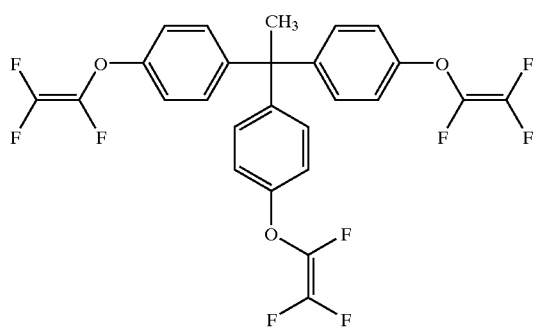

fluorobenzocyclobutene (BCB-F8)

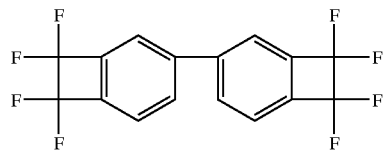

Especially preferable monomers and oligomers are compounds having an unsaturated hydrocarbon group such as a vinyl group on a benzene ring of benzocyclobutene, compounds having one or more benzocyclobutene structures in a molecule as shown below, derivatives thereof and oligomers formed therefrom.

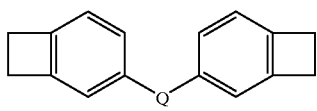

where Q represents the following groups.

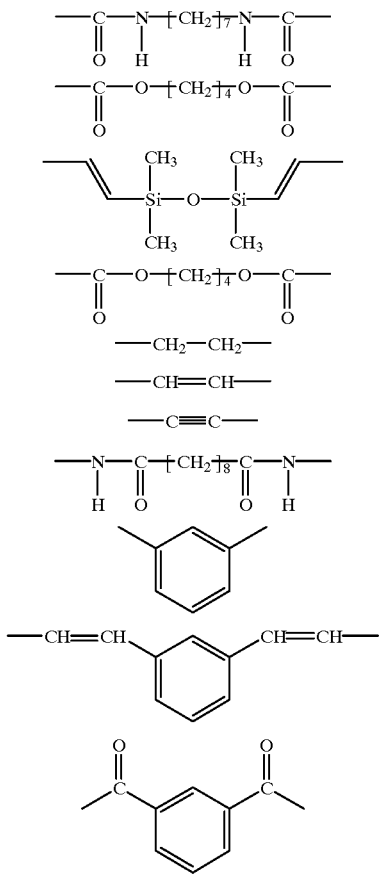

The monomer or the oligomer is fed to the surface of the substrate in a gaseous phase. The vaporized organic monomer or the vaporized organic oligomer fed is adsorbed on the surface of the substrate, and heat-polymerized with plasma and energy supplied by heating the substrate to form an organic polymer film on the surface of the substrate. When the monomer or the oligomer is liquid, it is vaporized by heating, heating and passage of an inert gas, vacuum heating or vacuum heating and passage of an inert gas, and fed to the surface of the substrate.

The polymerization conditions of the monomer or the oligomer vary with the type of the monomer or the oligomer. In the invention, it is preferable that the polymerization temperature is 200 to 400° C., the polymerization pressure is 1 to 10 torr and the feed rate of the monomer or the oligomer is 0.1 to 0.5 g/min. The rate of film formation can be controlled by selecting the feed rate and the polymerization temperature of the monomer or the oligomer. Further, it can accurately be controlled by selecting the feed rate, the film formation temperature and the film formation time of the monomer or the oligomer.

EXAMPLES

The invention is illustrated specifically by referring to the following Examples.

Example 1

In this Example, vaporization of divinylcyclohexanebisbenzocyclobutene (molecular weight 390 g/mol) as an organic monomer is described.

Divinylcyclohexanebisbenzocyclobutene (molecular weight 390 g/mol, hereinafter referred to as a BCB monomer) is a liquid having a viscosity of 75 cP at room temperature.

The total pressure of the vaporization vacuum chamber 57 in the organic monomer vaporization chamber 47 shown in FIG. 6 is determined with the flow rate of the carrier gas fed to the organic monomer vaporization chamber 47, the pressure of the plasma polymerization reaction chamber and the pressure loss of the vaporized feedstock piping that leads to the plasma polymerization reaction chamber. In this Example, the pressure of the plasma polymerization reaction chamber is 3 torr, and He is used as a carrier gas.

Figure 7:
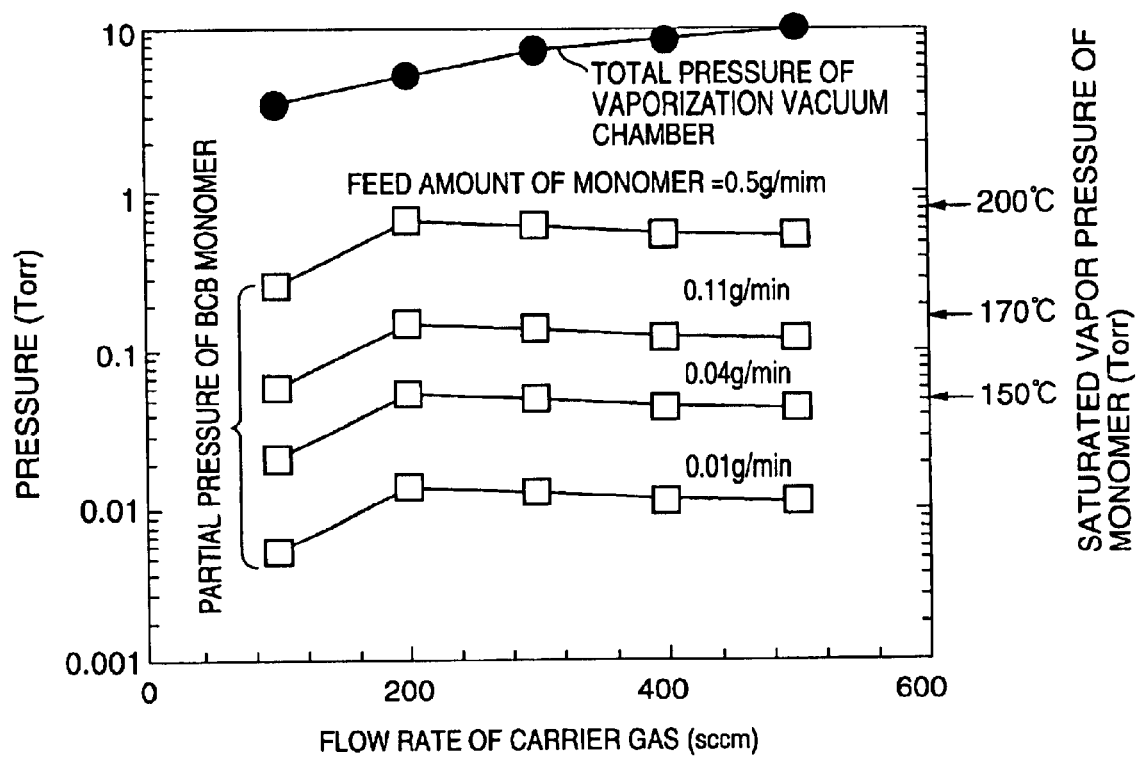
FIG. 7 is a graph showing a flow rate of a carrier gas, a total pressure in a vaporization chamber and a partial pressure of a BCB monomer when the vaporization method of the invention is applied to vaporization of a DVS-BCB monomer.

As shown in FIG. 7, the total pressure of the vaporization vacuum chamber 57 is increased as the flow rate of the He carrier gas is increased. In the vaporization of the BCB monomer, it is indispensable that the partial pressure of the BCB monomer in the vaporization vacuum chamber is lower than the saturated vapor pressure of the BCB monomer. FIG. 7 also shows the partial pressure of the BCB monomer in the vaporization vacuum chamber 57 when a predetermined amount of the BCB monomer is fed to the organic monomer vaporization chamber 47 and is all vaporized. The partial pressure of the BCB monomer is increased as the feed amount of the monomer is increased. The partial pressure of the BCB monomer does not show a great dependence on the flow rate of the carrier gas. The reason is as follows, That is, when the flow rate of the carrier gas is increased, the molar fraction of the BCB monomer in the vaporization vacuum chamber is decreased, but the total pressure is increased. Thus, the partial pressure (=total pressure×molar fraction) of the BCB monomer is offset, and no great change is provided.

Figure 8:
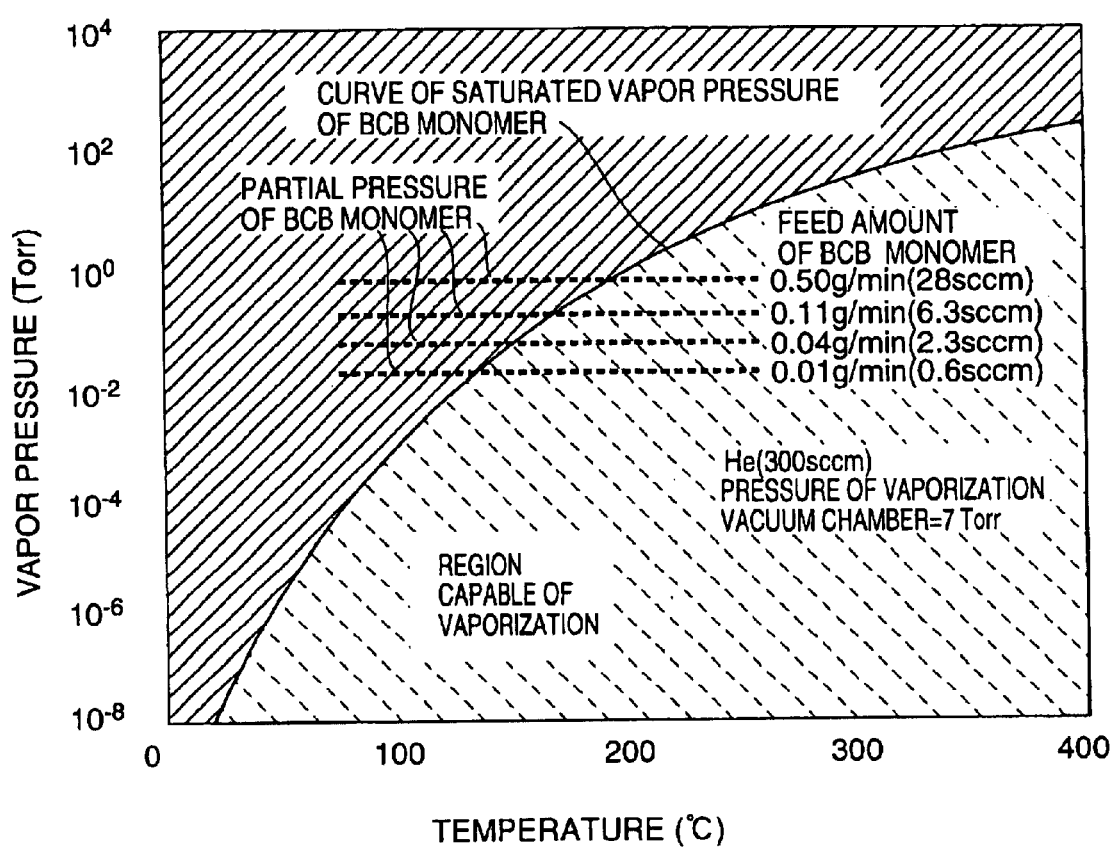
FIG. 8 is a graph showing a temperature dependence of a feed amount of a BCB monomer, a partial pressure of a BOB monomer and a saturated vapor pressure of a BCB monomer when the vaporization method of the invention is applied to a DVS-BCB monomer.

The saturated vapor pressure of the BCB monomer depends on the temperature. As shown in FIG. 8, the flow rate of the He carrier gas is set at 300 sccm. FIG. 8 shows the partial pressure of the BCB monomer obtained from FIG. 7. When the feed amount of the BCB monomer is as small as 0.01 g/min, the partial pressure of the BCB monomer is 0.012 torr. When the vaporization vacuum chamber 57 is heated at 130° C. or more with the block heater 63, the vaporization is theoretically possible. Meanwhile, when the feed amount of the BCB monomer is increased to 0.11 g/min, the partial pressure of the BCB monomer is 0.133 torr, and the heating at 170° C. or more is required. Further, when the temperature of the vaporization vacuum chamber 57 is increased to 200° C., the vaporization of 0.5 g/min of the BCB monomer is theoretically possible. The theoretical region capable of vaporization is below the saturated vapor pressure curve of the BCB monomer.

Subsequently, the BCB monomer is actually vaporized using the organic monomer vaporization chamber 47 shown in FIG. 6. A cooling trap is installed in the vaporized feedstock piping, and the vaporized BCB monomer is all re-liquefied, and recovered. A recovery rate is measured from a recovery amount of the BCB monomer relative to the feed amount thereof. The temperature of the vaporized feedstock piping 39 that leads to the cooling trap herein is the same as the temperature of the block heater in the vaporization vacuum chamber 57. The feed amount of the He carrier gas is set at 300 sccm.

Figure 9:
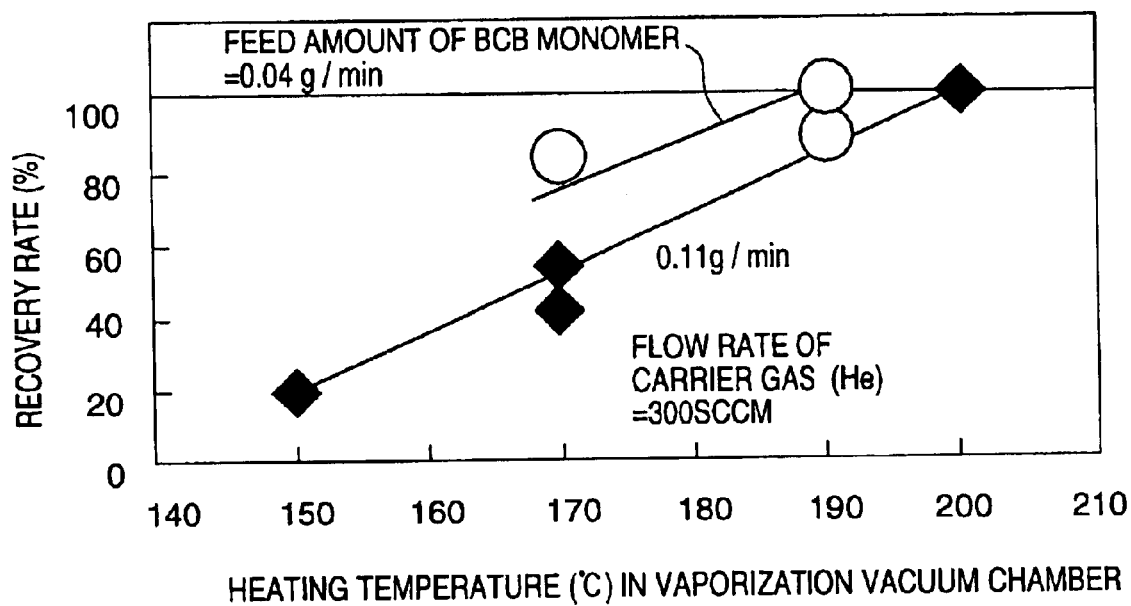
FIG. 9 is a graph showing a relation of a recovery rate of BCB monomer vaporization and a vaporization temperature when the vaporization method of the invention is applied to vaporization of a DVS-BCB monomer.

FIG. 9 shows a heating temperature in the vaporization vacuum chamber 57 and a recovery rate in vaporization.

When the feed amount of the BCB monomer is 0.04 g/min, the recovery rate is 80% at a temperature of 170° C. in the vaporization vacuum chamber 57, and reaches approximately 100% at 190° C. When the feed amount of the BCB monomer is 0.11 g/min, the recovery rate at 170° C. is decreased to approximately 40%. However, when the heating temperature is increased to 200° C., the recovery rate becomes 100%. In the method of the invention in which the aerosol of the BCB monomer is evaporated by heating, the evaporation rate is high because of the large specific surface area. Accordingly, the vaporization occurs instantaneously before the polymerization reaction is conducted by heating at a high temperature of 200° C. The 100% vaporization can be conducted in a feed amount of 0.5 g/min by heating at 250° C.

It is thus identified that the excess polymerization reaction can be controlled in the vaporization of the organic monomer by instantaneously vaporizing the aerosol of the organic monomer through heating.

Example 2

Figure 10:
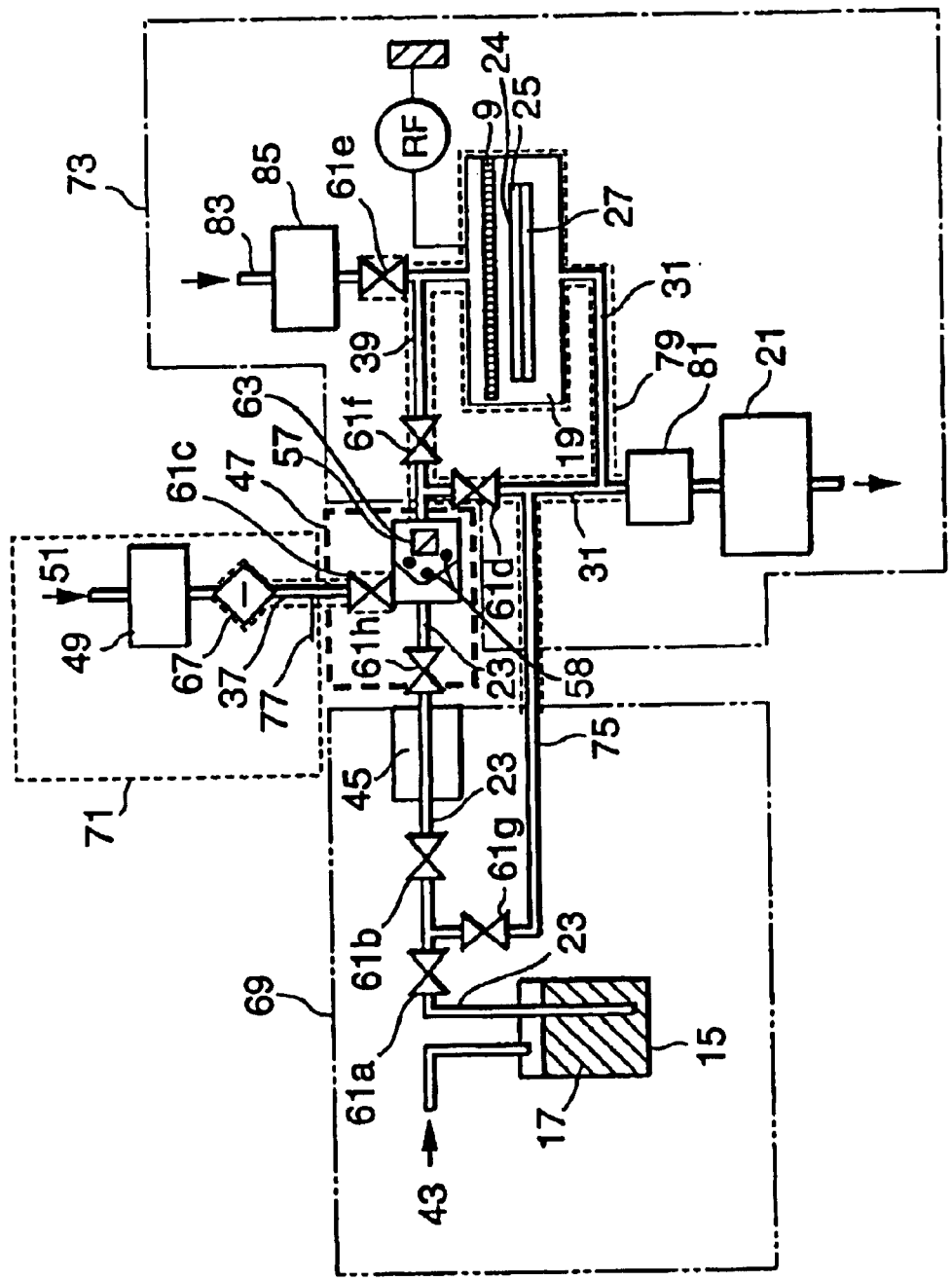
FIG. 10 is a schematic view of an apparatus for growth of a polymer film by plasma polymerization using the vaporization method of the invention.

In this Example, the vaporization method of the invention is applied to the growth of the BCB polymer film. As shown in FIG. 10, an apparatus for growth of a BCB polymer film comprises four regions, namely, a liquid organic monomer feedstock feed system 69, a carrier gas feed system 71, an organic monomer vaporization chamber 47 and a plasma polymerization reaction chamber system 73.

First, the liquid organic monomer feedstock feed system 69 is described. A BCB monomer 17, a liquid organic monomer, stored in the feedstock tank 15 is fed to a feedstock piping 23, and then to the organic monomer vaporization chamber 47 via a liquid mass flow controller 45 at a predetermined rate. The feedstock piping 23 is provided with solenoid valves 61a, 61b, 61c and a piping 75 for vacuum drawing so as to be able to conduct vacuum drawing in exchanging feedstock.

In the carrier gas feed system 71, an He carrier gas 51 is fed from the carrier gas piping 37 to the vaporization chamber 23 via the gas mass flow controller 49. Actually, the timing of feeding the He carrier gas is controlled with a solenoid valve 61c mounted between the vaporization chamber 47 and the mass flow controller 49. The carrier gas piping 37 is provided with a carrier gas heating filter 67, a thermocouple 77 and a piping heater 59, having a function to preheat the He carrier gas 51 as required. In this Example, the carrier gas is not heated.

The BCB monomer 17, an organic monomer and the He carrier gas 51 are fed to the organic monomer vaporization chamber 47 where the BCB monomer and the He carrier gas are mixed at a mixing nozzle portion to form a gas-liquid mixed fluid 55. The diameter of the mixing nozzle portion 53 is smaller than the diameters of the carrier gas piping 37 and the feedstock piping 23, and the fluid is sprayed from the mixing nozzle portion to the vaporization vacuum chamber 57. At this time, the gas-liquid mixed fluid 55 is converted into an aerosol 58 of the BCB monomer having a diameter of 100 μm or less in the vaporization vacuum chamber 57 owing to the abrupt pressure loss of the mixing nozzle portion 53 and the vaporization vacuum chamber 57. With respect to the formation of the aerosol 58, it is quite important to select the diameter of the mixing nozzle portion and the flow rate of the carrier gas. When the flow rate of the carrier gas is 100 to 500 sccm, the diameter of the mixing nozzle is 1 to 0.1 mm. In this Example, the diameter of the mixing nozzle is 0.8 mm. The block heater 63 heated at a predetermined temperature is installed in the vaporization vacuum chamber 57, and the aerosol 58 of the BCB monomer is heated via the block heater. This aerosol 58 is vaporized to form a BCB monomer gas 41 which is then discharged from the vaporized feedstock piping 39 along with the carrier gas.

Further, the BCB monomer gas (not shown in FIG. 10) is fed to the plasma polymerization reaction chamber system 73 via a vaporized feedstock piping 39. A plasma polymerization reaction chamber 19 is provided with a shower head 9 that can apply high frequency of 13.56 MHz. The BCB monomer gas is passed through He plasma formed under the shower head 9, and the polymerization reaction is conducted on a substrate 25 mounted on a substrate heater 27 heated at 300 to 420° C. to grow a BCB polymer film. An RF power is 50 to 100 W(0.1 to 0.2 W/cm$^2$).

A heater 79 is wound around the vaporized feedstock piping 39, the plasma polymerization reaction chamber 19 and a discharge piping 31 to prevent re-liquefaction of the organic monomer gas 41. The temperature of the vaporized feedstock piping 39 is the same as the heater heating temperature of the vaporization vacuum chamber 57. For example, when the vaporization temperature of the BCB monomer is set at 190° C., the temperature of the vaporized feedstock piping 39 is set at 190° C. The temperature of the plasma polymerization reaction chamber 19 is lower than the heater heating temperature by approximately 20° C., namely 150 to 170° C. The temperature of the discharge piping 31 is also set at 150 to 170° C. The discharge piping 31 is connected with a discharge pump 21 via a cooling trap 81. Further, for cleaning the inner wall of the plasma polymerization reaction chamber 19, a cleaning gas is introduced from a cleaning gas piping 83 via a cleaning gas mass flow meter. The cleaning gas is a mixed gas of $SF_6$ and oxygen or ozone which is introduced while an RF power is applied. The cleaning gas may be a mixed gas of a fluorocarbon gas such as $CF_4$ or $C_2F_6$ and oxygen or ozone.

Three solenoid valves 61d, 61e, 61f are installed in the plasma polymerization reaction chamber system 73. The actuation of the series of the solenoid valves in the growth of the BCB polymer film is described. The BCB monomer gas vaporized in the vaporization vacuum chamber is first discharged through the vaporized feedstock piping 39. The solenoid valve 61d alone is first "opened" to discharge the BCB monomer gas at the initial stage of the vaporization without introducing the same into the plasma polymerization reaction chamber 19. This state usually continues for 5 to 10 seconds. This is for discharging the vaporized gas of the BCB monomer remaining within the mixing nozzle portion 53 in the vaporization vacuum chamber. Thereafter, the solenoid valve 61f is "opened", and the solenoid valve 61d is closed, whereby the BCB monomer gas is introduced into the plasma polymerization reaction chamber 19. At the initial stage in which the gas is introduced into the plasma polymerization reaction chamber 19, the pressure is instable. For this reason, the BCB monomer gas continuously flows for 10 seconds without applying an RF power to the shower head 9.

Subsequently, the RF power is turned on to grow a plasma polymerization BCB polymer film 24 on a substrate 25. After the growth for a predetermined period of time, the RF power is turned off, and the solenoid valve 61h is then closed to stop the feeding of the BCB monomer to the vaporization vacuum chamber 57 and feed the carrier gas 51 alone to the plasma polymerization reaction chamber via the vaporized feedstock piping 39 for 30 seconds. Then, the valves 61c, 61f are closed, the vacuum drawing of the plasma polymerization reaction chamber 19 is conducted for 10 seconds, and the substrate 25 is taken out into a substrate transport chamber (not shown). Further, the solenoid valve 61e is opened to introduce the cleaning gas, and the RF power is turned on to conduct plasma cleaning of the inner wall of the plasma polymerization reaction chamber 19. The solenoid valve 61e is then closed again, the vacuum drawing of the plasma polymerization reaction chamber 19 is conducted, and a next substrate is set.

Figure 11:
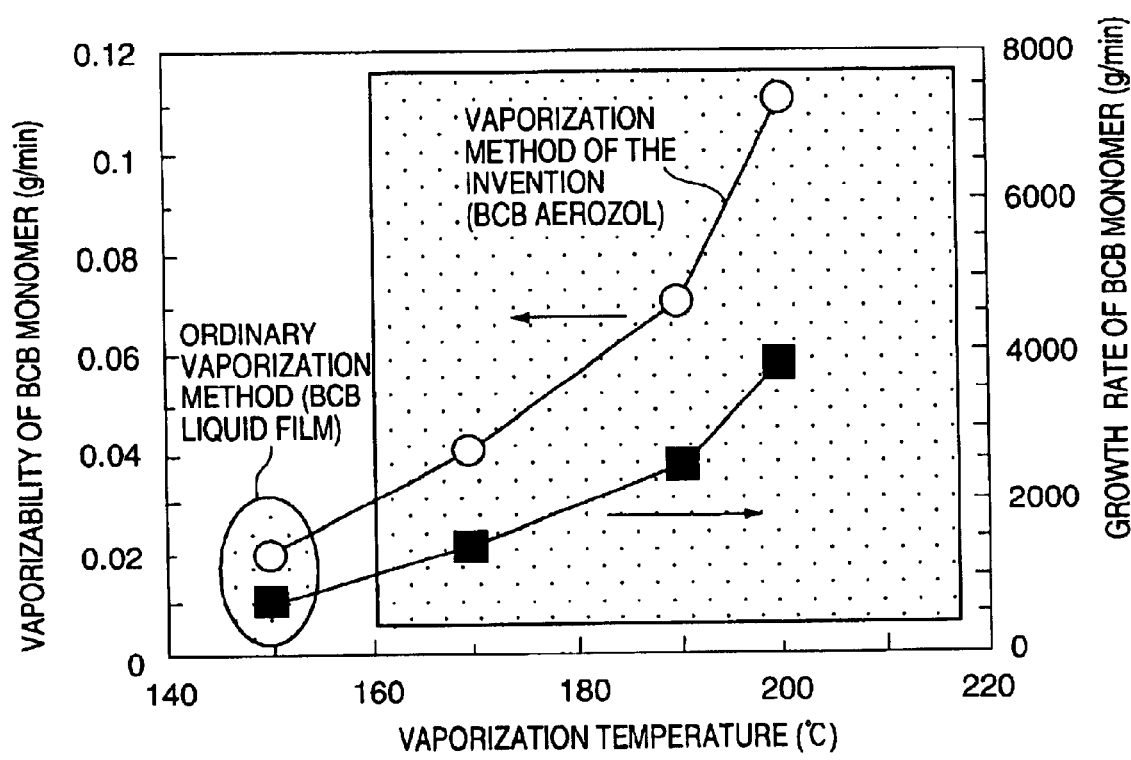
FIG. 11 is a graph showing a relation of a vaporization temperature, a feed rate of a vaporizable BCB monomer and a growth rate of a plasma polymerization BCB film in an apparatus for growth of a polymer film by plasma polymerization using the vaporization method of the invention.

The growth rate of the plasma polymerization BCB polymer film and the rate of vaporization (vaporizability) of the BCB monomer in using the apparatus for growth of the BCB polymer film are described by referring to FIG. 11. A substrate heating temperature is 400° C., a pressure of the plasma polymerization reaction chamber is 3 torr, and an RF power is 50 W (0.1 W/cm$^2$). In the method of the invention in which the aerosol of the BCB monomer is instantaneously vaporized, the vaporization temperature can be 200° C., and the vaporization rate of the BCB monomer reaches 0.1 g/min or more. Consequently, the growth rate of the plasma polymerization BCB film on the 8-inch substrate becomes approximately 4,000 A/min to achieve a level which is not problematic in actual use. Meanwhile, in the ordinary vaporization system shown in FIG. 3, the BCB monomer liquid film is evaporated by heating. Therefore, the vaporization rate is low. For avoiding the polymerization reaction of the BCB monomer before the vaporization, the upper limit of the vaporization temperature is approximately 150° C. Consequently, the vaporization rate is as low as 0.02 g/min, and the growth rate of the plasma polymerization BCB polymer film is 500 to 700 A/min.

Figure 12:
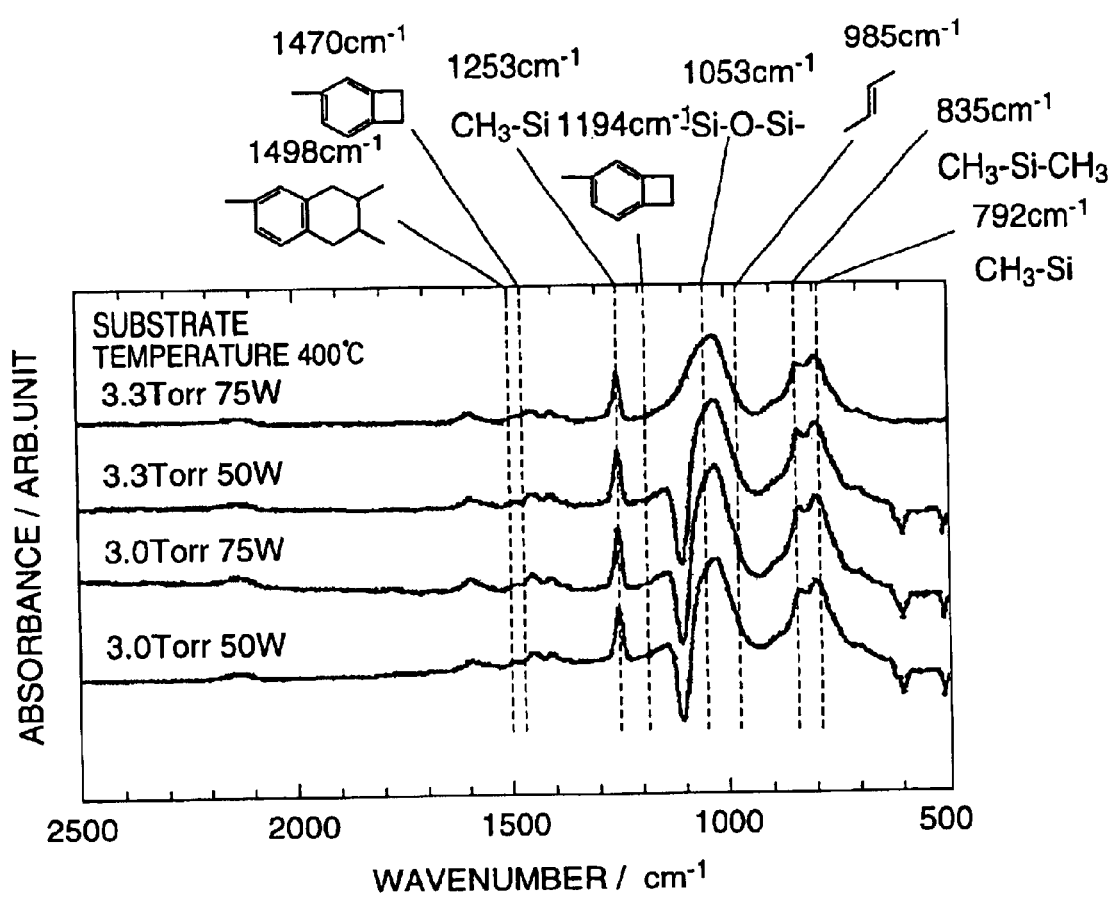
FIG. 12 is an FTIR spectrum of a plasma polymerization BCB film by an apparatus for growth of a polymer film by plasma polymerization using the vaporization method of the invention.

As shown in FIG. 12, an infrared absorption spectrum of the plasma polymerization BCB polymer film obtained with the apparatus for growth of the polymer film using the method for vaporization of the organic monomer according to the invention is obtained on condition that the pressure of the plasma polymerization reaction chamber is 3 torr or 3.3 torr and the RF power is 50 W (0.1 W/cm$^2$) or 75 W (0.15 W/cm$^2$, It is identified that a polymer film made of DVS-BCB is obtained in both cases. The specific dielectric constant of the plasma polymerization BCB polymer film is 2.5 to 2.7.

Example 3

In this Example, the vaporization method of the invention is applied to the growth of the BCB polymer film as in Example 2. However, this Example is, unlike Example 2, characterized in that an organic monomer vaporization chamber 47 and a plasma polymerization reaction chamber 19 are connected through a vaporized feedstock piping 39 alone. This makes it possible that the organic monomer vaporization chamber is quite close to the plasma polymerization reaction chamber. Since the presence of the valve 61f or the long vaporized feedstock piping described in Example 2 leads to the pressure loss, restriction is increased in case of using low vapor pressure feedstock such as a BCB monomer. For this reason, it is advisable that the organic monomer vaporization chamber and the plasma polymerization reaction chamber are connected to minimize the pressure loss. Specifically, it is preferable that they are adjacent to each other.

Figure 13:
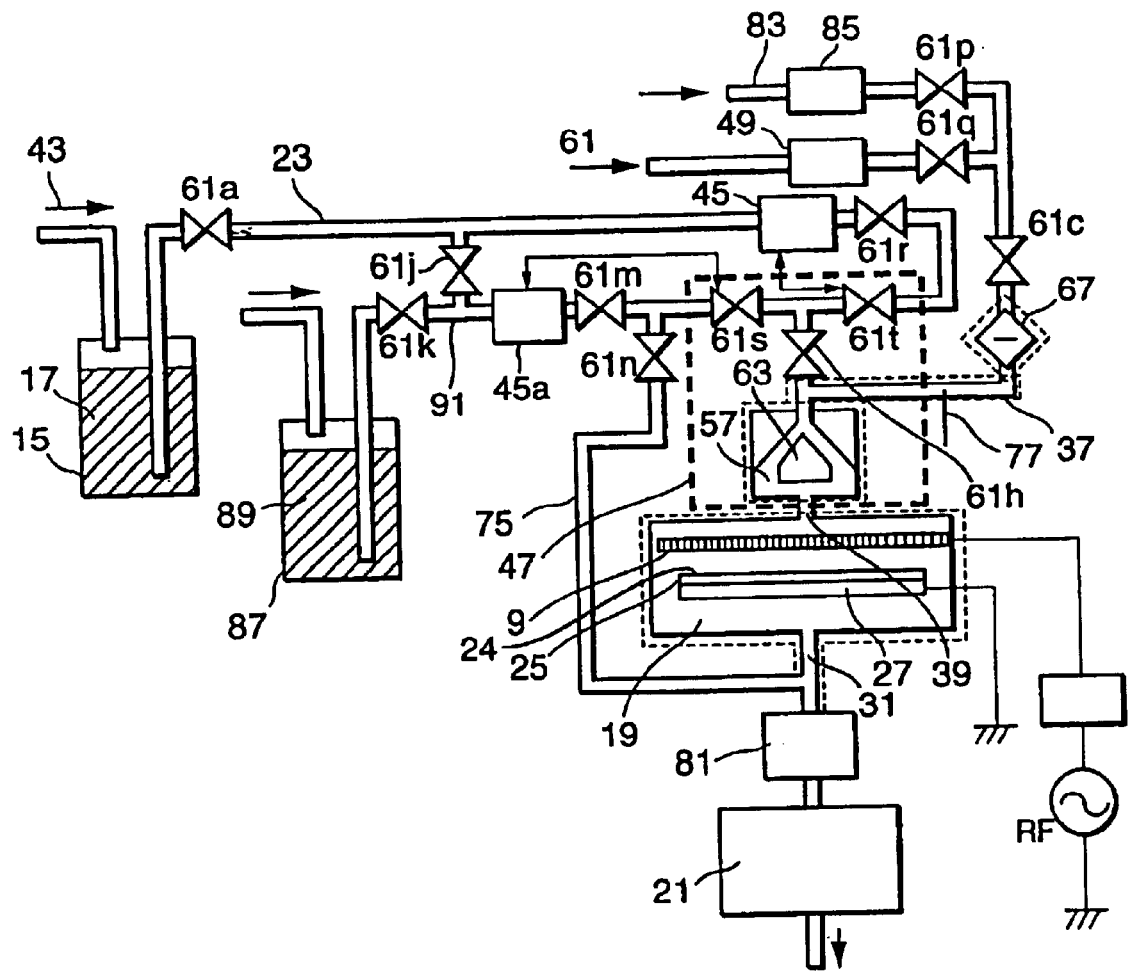
FIG. 13 is a schematic view of an apparatus for growth of a polymer film by plasma polymerization using the vaporization method of the invention.

As shown in FIG. 13, in an apparatus for growth of a BCB polymer film in this Example as well, a BCB monomer 17, a liquid organic monomer, stored in a feedstock tank 15 is fed to a feedstock piping 23 and then to the organic monomer vaporization chamber 47 via a liquid mass flow controller 45b at a predetermined rate. The feedstock feed piping 23 is provided with a piping for vacuum drawing, though not shown, as in Example 2 such that the vacuum drawing can be conducted in exchanging feedstock.

The vaporization apparatus is also provided with a valve 61s for introducing a cleaning solvent, though not shown, to clean the inside of the organic monomer vaporization chamber 47. When the piping is cleaned, a solvent 89 stored in a cleaning solvent tank 87 is fed to a solvent piping 91 and then to an organic monomer vaporization chamber via a liquid mass flow controller 45a and valves 61m, 61s. Consequently, the liquid organic monomer in the valves 61s, 61t, 61h and a piping for connecting these with a vaporization vacuum chamber 57 is purged. Further, for cleaning also the feedstock piping 23 with the cleaning solvent, the cleaning solvent is adapted to be fed to the feedstock piping via a valve 61j. Further, the solvent piping 91 is also provided with a piping for vacuum drawing, though not shown, as in the feedstock piping 23.

A carrier gas is fed as in Example 2. However, since the organic monomer vaporization chamber 47 is adjacent to the plasma polymerization reaction chamber 19, a cleaning gas piping 83 is connected with a carrier gas piping via a cleaning gas mass flow controller 81, which is different from Example 2. In cleaning the plasma polymerization reaction chamber, a valve 61q on the side of the carrier gas is closed, and a valve 61p on the side of the cleaning gas is opened to introduce the cleaning gas. The cleaning gas is the same as in Example 2.

The vaporization of the BCB monomer, the feeding of the He carrier gas and the formation of the BCB polymer film are the same as in Example 2 except that the vaporization feedstock piping 39 is very short.

The actuation of the series of the solenoid valves in the growth of the BCB polymer film in this Example is described. First, the BCB monomer gas vaporized in the vaporization vacuum chamber is introduced into the plasma polymerization reaction chamber 19 via the vaporized feedstock piping 39. In this Example, unlike Example 2, the vaporized BCB monomer gas is fed to the plasma polymerization reaction chamber 19 also at the initial stage of feeding the BCB monomer. There is a fear of the influence of the vaporized gas from the BCB monomer remaining in a mixing nozzle portion 53 of the vaporization vacuum chamber. However, in case of using the BCB monomer, the rate of film formation is negligibly low at the substrate temperature described in Examples when no RF power is applied Thus, there is no such influence.

Thereafter, the RF power is applied for a predetermined period of time as in Example 2 to grow a plasma polymerization BCB polymer film on the substrate 25. Then, the RF power is turned off, the solenoid valve 61h is closed to stop the feeding of the BCB monomer to the vaporization vacuum chamber 57, and the carrier gas 61 alone is fed to the plasma polymerization reaction chamber via the vaporized feedstock piping 39 for 30 seconds.

Thereafter, the valves 61q, 61c are closed, the vacuum drawing of the plasma polymerization reaction chamber 19 is conducted for 10 seconds, and the substrate 25 is taken out on a substrate transport chamber (not shown). Further, the valves 61p, 61c are opened to introduce a cleaning gas, and the RF power is turned on to conduct plasma cleaning of the inner wall of the plasma polymerization reaction chamber 19. Then, the solenoid valves 61q, 61c are closed again, the vacuum drawing of the plasma polymerization reaction chamber 19 is conducted, and a next substrate is set.

The characteristics of the plasma polymerization BCB polymer film obtained in this Example are the same as in Example 2.

As has been thus far stated, in the invention, the vaporization efficiency can be increased by mixing the organic monomer constituting the organic polymer film formed on the semiconductor substrate with the carrier gas at a low temperature and spraying the mixture to improve the specific surface area as fine particles of the liquid monomer. Especially, when, in case of the organic monomer, the temperature is increased to increase the saturated vapor pressure, the polymerization reaction of the organic monomer occurs. However, the invention makes it possible that the organic monomer is heated at a high temperature and instantaneously vaporized before the polymerization reaction occurs, providing the effect that the growth rate of the polymer film by the plasma polymerization of the vaporized organic monomer can be improved.

Moreover, the invention grows the polymer film in high vacuum through plasma. Consequently, the high-quality polymer film can be obtained without causing the reaction of the partial oxidation of the polymer film by which to deteriorate the insulation property and increase the specific dielectric constant. The quite excellent effect is brought forth for the growth of the polymer film used as the layer-to-layer insulation film with the low dielectric constant in combination with a copper wiring that extremely hates the oxidation.

What is claimed is:

1. A method for vaporization of liquid organic feedstock made of an organic monomer or an organic oligomer capable of forming an organic polymer insulation film by feeding the liquid organic feedstock to a vaporization controller, which comprises:

a first step of mixing the liquid organic feedstock with a carrier gas at a temperature lower than a heat polymerization reaction starting temperature of the liquid organic feedstock to form a gas-liquid mixed fluid;

a second step of spraying the gas-liquid mixed fluid on a vaporization vacuum chamber to form an aerosol of the liquid organic feedstock and heating the aerosol; and a third step of vaporizing the liquid organic feedstock through the aerosol.

2. The method as claimed in claim 1, wherein the aerosol has a diameter of 100 to 1 µm.

3. The method as claimed in claim 1, wherein the liquid organic feedstock is a divinylsiloxanebisbenzocyclobutene monomer represented by the formula.

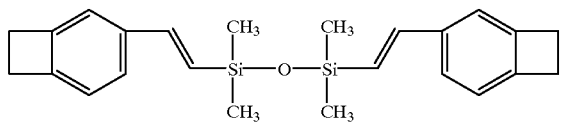

4. The method as claimed in claim 1, wherein
said first step is that the gas-liquid mixed fluid made of 100 to 500 ml/min of the carrier gas and 0.1 to 0.5 g/min of the liquid organic feedstock in a standard condition, said second step being that the gas-liquid mixed fluid is sprayed on the vaporization vacuum chamber held at 1.3 kPa (10 torr) or less, and said third step being that the gas-liquid mixed fluid is heated at a temperature of 160 to 250° C. to vaporize the liquid organic feedstock.

5. A method of growing an insulation film on a substrate by the use of a process for vaporization of a liquid organic feedstock, said insulation film being an organic polymer film made of the liquid organic feedstock, said process comprises:

a first step of mixing the liquid organic feedstock with a carrier gas at a temperature lower than a heat polymerization reaction starting temperature of the liquid organic feedstock to form a gas-liquid mixed fluid;

a second step of spraying the gas-liquid mixed fluid on a vaporization vacuum chamber to form an aerosol of the liquid organic feedstock and heating the aerosol; and a third step of vaporizing the liquid organic feedstock through the aerosol.

6. The method as claimed in claim 5, wherein the aerosol has a diameter of 100 to 1 µm.

7. The method as claimed in claim 5, wherein the liquid organic feedstock is a divinylsiloxanebisbenzocyclobutene monomer represented by the formula.

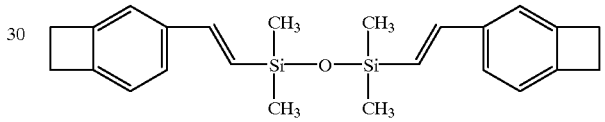

8. The method as claimed in claim 5, wherein
said first step is that the gas-liquid mixed fluid made of 100 to 500 ml/min of the carrier gas and 0.1 to 0.5 g/min of the liquid organic feedstock in a standard condition, said second step being that the gas-liquid mixed fluid is sprayed on the vaporization vacuum chamber held at 1.3 kPa (10 torr) or less, and said third step being that the gas-liquid mixed fluid is heated at a temperature of 160 to 250° C. to vaporize the liquid organic feedstock.

9. A method of growing an insulation film on a substrate, composing: providing a vaporization device for heating an aerosol of liquid organic feedstock to vaporize the liquid organic feedstock through the aerosol to form vaporized organic feedstock, and connecting said vaporizing device directly to a plasma polymerization reaction chamber, whereby the vaporized organic feedstock feeds directly to plasma in the plasma polymerization reaction chamber to grow on a substrate an organic polymer film made of the liquid organic feedstock.

* * * * *